US012191816B2

(12) United States Patent
Granger-Jones

(10) Patent No.: US 12,191,816 B2
(45) Date of Patent: Jan. 7, 2025

(54) COMPLEMENTARY BALANCED LOW-NOISE AMPLIFIER CIRCUIT

(71) Applicant: Qorvo US, Inc., Greensboro, NC (US)

(72) Inventor: Marcus Granger-Jones, Scotts Valley, CA (US)

(73) Assignee: Qorvo US, Inc., Greensboro, NC (US)

(*) Notice: Subject to any disclaimer, the term of this patent is extended or adjusted under 35 U.S.C. 154(b) by 522 days.

(21) Appl. No.: 17/643,675

(22) Filed: Dec. 10, 2021

(65) Prior Publication Data

US 2023/0188096 A1 Jun. 15, 2023

(51) Int. Cl.
*H03F 1/22* (2006.01)
*H03F 1/26* (2006.01)
*H03F 1/56* (2006.01)

(52) U.S. Cl.
CPC .............. *H03F 1/223* (2013.01); *H03F 1/26* (2013.01); *H03F 1/565* (2013.01); *H03F 2200/294* (2013.01)

(58) Field of Classification Search
CPC . H03F 1/223; H03F 1/26; H03F 1/565; H03F 2200/294; H03F 3/3001; H03F 3/3032; H03F 2200/42; H03F 2200/451; H03F 2200/48; H03F 2200/75; H03F 2203/30081; H03F 2203/30114; H03F 3/195; H03F 3/602; H03F 1/0288; H03F 3/211
USPC .............................................. 330/124 R, 295
See application file for complete search history.

(56) References Cited

U.S. PATENT DOCUMENTS

| | | | | |
|---|---|---|---|---|
| 6,087,900 A * | 7/2000 | Lee | ........................ | H03F 3/3028 330/264 |
| 7,414,478 B2 * | 8/2008 | Elmala | .................. | H03F 1/0288 330/295 |
| 8,346,179 B2 * | 1/2013 | Brunn | ................. | H03F 3/45188 455/88 |
| 9,853,614 B2 * | 12/2017 | Wang | ..................... | H03F 3/3022 |
| 9,917,614 B1 * | 3/2018 | Kang | ................... | H03G 1/0029 |
| 10,673,401 B2 * | 6/2020 | Ayranci | .................. | H03F 3/193 |

(Continued)

OTHER PUBLICATIONS

Cha, H.-K. et al., "A CMOS MedRadio Receiver RF Front-End with Complementary Current-Reuse LNA for Biomedical Applications," IEEE Asian Solid-State Circuits Conference, Nov. 8-10, 2010, Beijing, China, IEEE, 4 pages.

(Continued)

*Primary Examiner* — Khanh V Nguyen
(74) *Attorney, Agent, or Firm* — Withrow & Terranova, P.L.L.C.

(57) ABSTRACT

A complementary balanced low-noise amplifier is disclosed. In one aspect, the low-noise amplifier (LNA) may be a single-ended cascoded complementary common-source LNA that is capable of operating in low-power conditions. In particular, the LNA may include a first path with a common-source amplifier formed from an N-type material and a second path with a common-source amplifier formed from a P-type material that collectively form a complementary common-source amplifier. By providing two paths in the complementary amplifier, headroom may be preserved for output transistors. Additionally, higher-order intercept points (e.g., IP2 or IP3) characteristics have better performance profiles resulting in better overall performance and improved user experience.

19 Claims, 4 Drawing Sheets

(56) References Cited

U.S. PATENT DOCUMENTS

| | | | | |
|---|---|---|---|---|
| 2010/0291881 A1* | 11/2010 | Brunn | ............... | H03F 3/45188 |
| | | | | 455/73 |
| 2011/0304395 A1* | 12/2011 | Koo | ..................... | H03F 1/223 |
| | | | | 330/296 |
| 2016/0164476 A1* | 6/2016 | Wang | .................... | H03F 1/223 |
| | | | | 330/250 |

OTHER PUBLICATIONS

Wu, H.-I. et al., "Complementary UWB LNA Design Using Asymmetrical Inductive Source Degeneration," IEEE Microwave and Wireless Components Letters, vol. 20, No. 7, Jul. 2010, IEEE, pp. 402-404.

* cited by examiner

COMPLEMENTARY BALANCED LOW-NOISE AMPLIFIER CIRCUIT

BACKGROUND

I. Field of the Disclosure

The technology of the disclosure relates generally to a low-noise amplifier (LNA), and particularly, to a balanced common-source LNA.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. With the advent of the myriad functions available to such devices, there has been increased pressure to find ways to reduce power consumption. One way that power consumption has been reduced is a hard cap on overall power consumption with low supply voltages and low currents. While such approaches may reap easy power consumption profile improvement, such approaches may compromise performance parameters dictated by wireless communication standards. Radio frequency front end (RFFE) modules, and particularly amplifiers in such RFFE modules in mobile communication devices face these conflicting design requirements. Accordingly, improvements to amplifier circuitry may allow designers greater flexibility.

SUMMARY

Aspects disclosed in the detailed description include a complementary balanced low-noise amplifier circuit. In an exemplary aspect, a low-noise amplifier (LNA) may be a single-ended cascoded complementary common-source LNA that is capable of operating in low-power conditions. In particular, the LNA may include a first path with a common-source amplifier formed from an N-type material and a second path with a common-source amplifier formed from a P-type material that collectively form a complementary common-source amplifier. By providing two paths in the complementary amplifier, headroom may be preserved for output transistors. Additionally, higher-order intercept points (e.g., IP2 or IP3) characteristics have better performance profiles resulting in better overall performance and improved user experience.

In this regard in one aspect, an amplifier is disclosed. The amplifier comprises an input configured to receive a signal. The amplifier also comprises an output. The amplifier also comprises a first path. The first path comprises a first common-source transistor. The amplifier also comprises a second path. The second path comprises a third common-source transistor. The first path is coupled to the second path at the input and the output.

DETAILED DESCRIPTION

Figure 1:
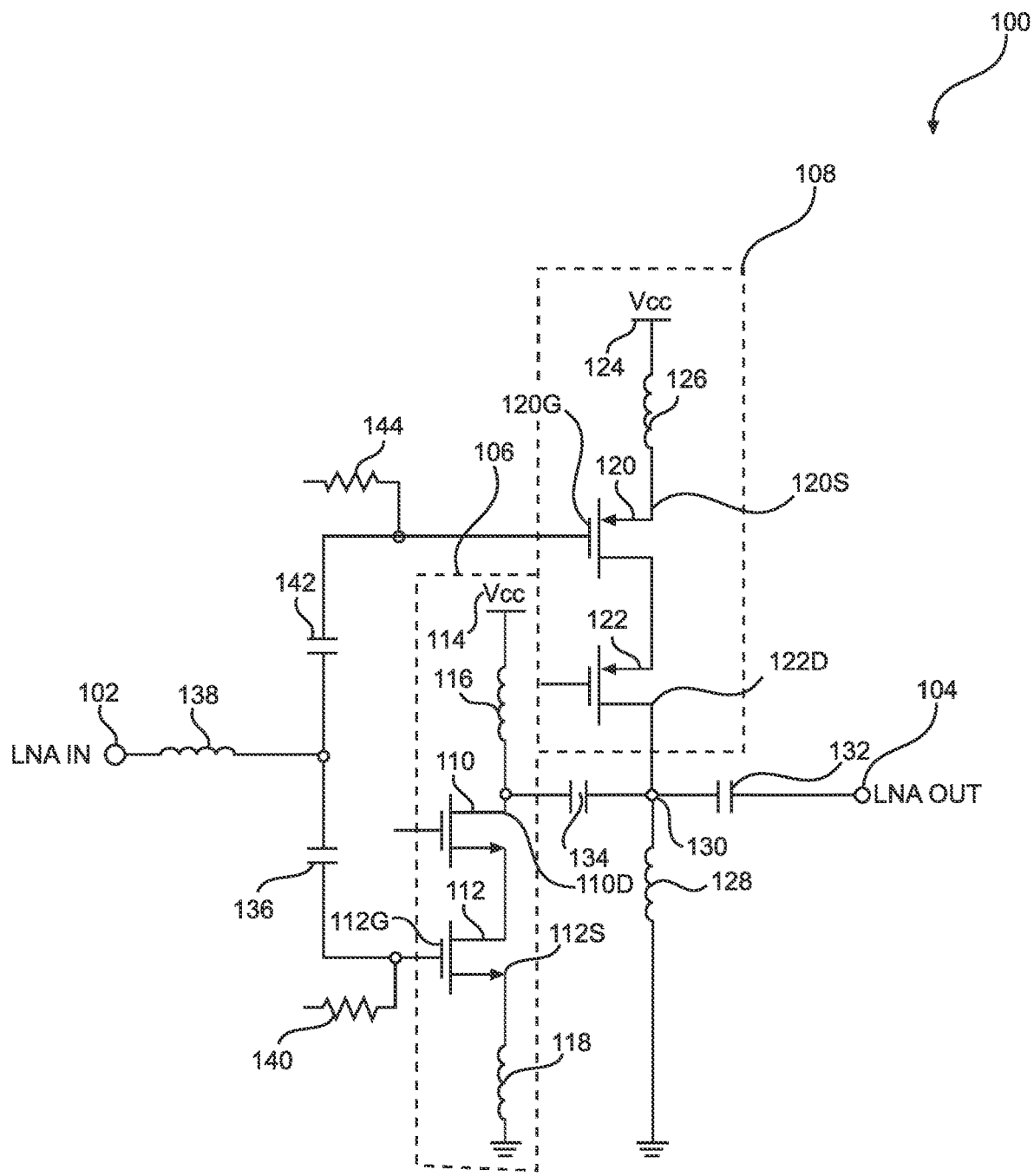
FIG. 1 is a circuit diagram of an exemplary single-ended complementary low-noise amplifier (LNA) having a cascoded common-source topology.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a complementary balanced low-noise amplifier. In an exemplary aspect, a low-noise amplifier (LNA) may be a single-ended complementary cascoded common-source LNA that is capable of operating in low-power conditions. In particular, the LNA may include a first path with a common-source amplifier formed from an N-type material and a second path with a common-source amplifier formed from a P-type material that collectively form a complementary common-source amplifier. By providing two paths in the complementary amplifier, headroom may be preserved for output transistors. Additionally, higher-order intercept points (e.g., IP2 or IP3) characteristics have better performance profiles resulting in better overall performance and improved user experience.

It should be appreciated that radio frequency front end (RFFE) modules in Fifth Generation-New Radio (5G NR) compatible communication devices operate in a complex intermodulation distortion (IMD) environment. Transmit blockers may be present at any of the cellular uplink transmit bands. Additional blockers may be present for WIFI, BLUETOOTH, 3G or the like along with external blocking signals picked up by an antenna. To stop desensitization of the receiver through intermodulation between these various blocking signals, filters may be applied prior to amplification in an LNA. However, there are additional requirements placed on the LNA such as linear operation and having sufficiently high second order intercept point (IP2) and third order intercept point (IP3) that the blockers do not intermodulate to create an in-band intermodulation product. Accordingly, improvements in the IP2 of the LNA may allow for relaxation of the filtering requirements between an antenna and the LNA. Such improvement to the IP2 should be made without degrading a noise function (NF) or IP3.

Exemplary aspects of the present disclosure provide a single-ended complementary common-source, common-gate LNA that is capable of operating at low supply voltages (e.g., <1.2 volts (V)), with high gain (~20 decibels (dB)), NF<0.6 dB, IP3 (~0 decibel-milliwatts (dBm)), and IP2 (>+20 dBm), with a low overall power consumption. This combination of design criteria has, as of this writing, not been possible without compromising on one of the requirements. Exemplary aspects of the present disclosure provide a cascoded source degenerated common-source complementary LNA circuit having parallel paths with no sharing between transistors in the different paths. In a specifically contemplated aspect, the transistors are field effect transistors (FETs) and one path has N-type FETs (NFETs) and the other path has P-type FETs (PFETs). To assist in speed for the PFETs, the PFETs may use strain engineering to improve the hole mobility in the channel.

In this regard, FIG. 1 is a circuit diagram of a first exemplary aspect of an amplifier 100 the present disclosure. The amplifier 100 may be an LNA. The amplifier 100 may include an input 102 configured to receive a signal. In an exemplary aspect, the signal may be a radio frequency (RF) signal from an antenna (not shown). The amplifier 100 may further include an output 104. The amplifier 100 may further include a first path 106 and a second path 108. Both the first path 106 and the second path 108 are coupled to the input 102 and the output 104 and are electrically parallel to one another without sharing a common current.

The first path 106 may include a first transistor 110, which may be an NFET and may further be a common-source transistor, and a second transistor 112 cascoded relative to the first transistor 110. The second transistor 112 may be an NFET as well. Further, the first path 106 may have a voltage input 114, which may be coupled to a voltage rail Vcc or the like. The voltage input 114 may be coupled to a drain 110D of the first transistor 110 through a first inductor 116. A source 112S of the second transistor 112 may be coupled to ground through a second inductor 118.

The second path 108 may include a third transistor 120, which may be a PFET and may also be considered a common-source transistor, and a fourth transistor 122 cascoded relative to the third transistor 120. The fourth transistor 122 may be a PFET as well. Further, the second path 108 may have a voltage input 124, which may be coupled to the voltage rail Vcc or the like. The voltage input 124 may be coupled to a source 120S of the third transistor 120 through a third inductor 126. A drain 122D of the fourth transistor 122 may be coupled to ground through a fourth inductor 128. The NFETs and PFETs of the amplifier 100 may be made using bulk or silicon-on-insulator (SOI) complementary metal-oxide semiconductor (CMOS) processes that use strain engineering to improve the hole mobility in the PFET channel.

Between the drain 122D and the fourth inductor 128, a node 130 may be defined. The node 130 may be coupled to the output 104 through a first capacitor 132 and to the drain 110D of the first transistor 110 through a second capacitor 134.

The first path 106, and particularly a gate 112G of the second transistor 112, is coupled to the input 102 through a capacitor 136 and an input inductor 138. A resistor 140 is also coupled to the gate 112G.

The second path 108, and particularly a gate 120G of the third transistor 120, is coupled to the input 102 through a capacitor 142 and the input inductor 138. A resistor 144 is also coupled to the gate 120G.

By coupling both voltage inputs 114, 124 to a common voltage source (e.g., Vcc), the paths may be thought of as common source. Likewise, the presence of both NFETs and PFETs makes this a complementary LNA architecture. The NFETs and PFETs are placed in parallel cascode stacks with no current sharing. The presence of the inductors 116, 126 between the voltage inputs 114, 124 and the transistors 110, 120 makes the design a source degenerated architecture.

In use, the two paths allow the voltage supply to be lower than that required by a large cascode amplifier stack. That is, for example, instead of having to support the headroom for four or more transistors, the supply voltage only need support the headroom for two to three transistors. This allows the supply voltage to be less than, for example, 1.2 V while still supporting a high gain from the amplifier 100. Additionally, this arrangement gives a significantly higher IP3 compared to prior designs. Likewise, the complementary structure gives good second order intermodulation (IM2) cancelation between the complementary paths. This may, for example, provide a 20 dB improvement over conventional single-ended NFET LNA architectures. These changes allow relaxation of filtering requirements between the antenna and the amplifier 100.

While the amplifier 100 is one approach to providing an improved amplifier, other structures are also possible and contemplated by the present disclosure. In this regard, an amplifier 200 illustrated in FIG. 2 uses different input and output matching structures to split and combine the signals between two paths. In particular, the amplifier 200 uses mutual coupling between the source degeneration and load inductors. Such approach may allow for a more compact layout of the amplifier 200 relative to the amplifier 100, especially if the coupled inductor structures make use of broadside coupled inductors. The polarity of the mutual coupling between inductors can be designed to make the absolute value of the inductors smaller, which may allow for further reductions in size.

Figure 2:
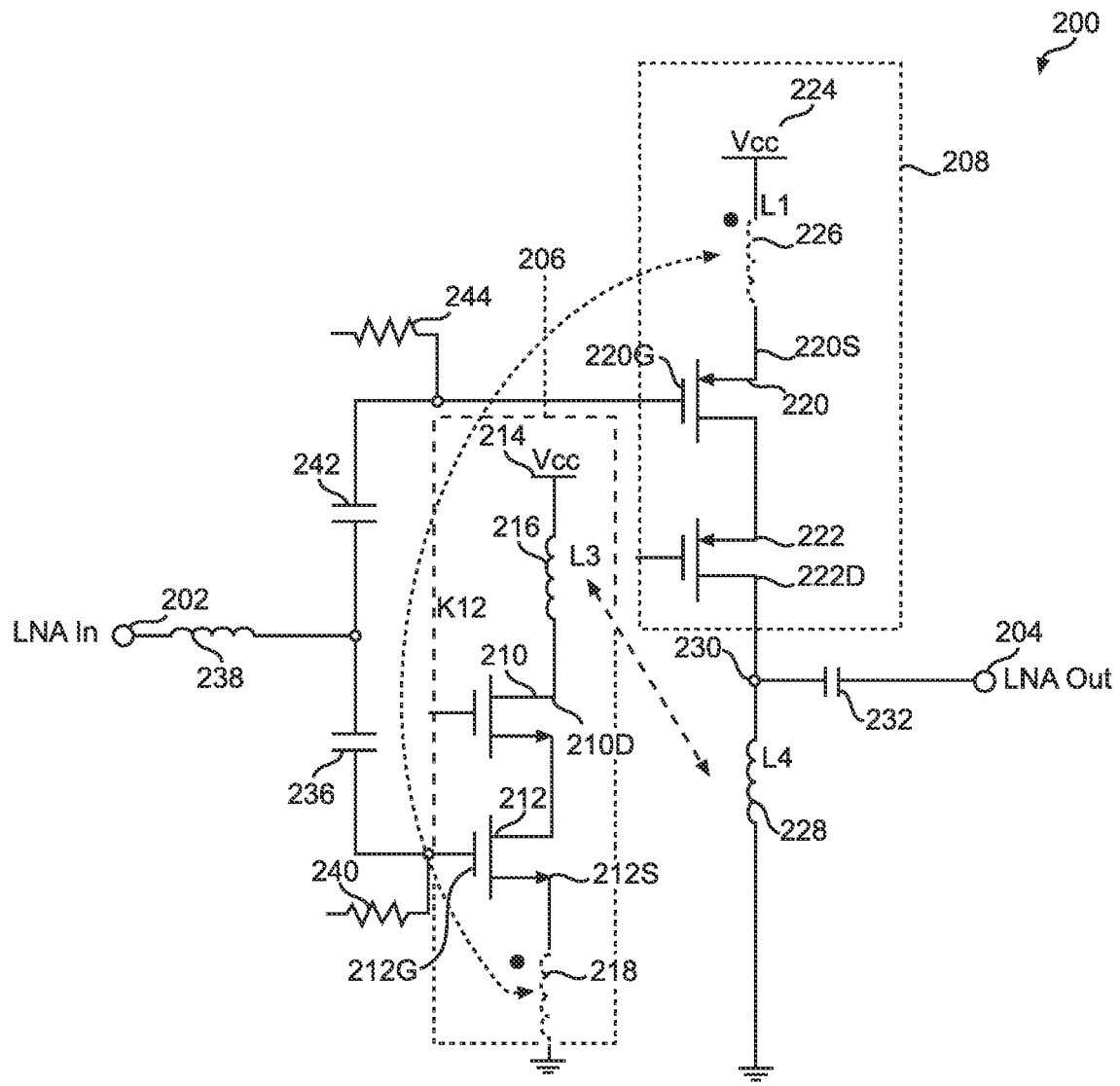
FIG. 2 is a circuit diagram of another exemplary single-ended complementary LNA based on cascoded common-source topology using inductors to couple complementary branches.

More specifically, as illustrated in FIG. 2, the amplifier 200 may be an LNA. The amplifier 200 may include an input 202 configured to receive a signal. In an exemplary aspect, the signal may be an RF signal from an antenna (not shown). The amplifier 200 may further include an output 204. The amplifier 200 may further include a first path 206 and a second path 208. Both the first path 206 and the second path 208 are coupled to the input 202 and the output 204 and are electrically parallel to one another without sharing any current.

The first path 206 may include a first transistor 210, which may be an NFET, and a second transistor 212 cascoded relative to the first transistor 210. The second transistor 212 may be an NFET as well. Further, the first path 206 may have a voltage input 214, which may be coupled to a voltage rail Vcc or the like. The voltage input 214 may be coupled to a drain 210D of the first transistor 210 through a first inductor 216. A source 212S of the second transistor 212 may be coupled to ground through a second inductor 218.

The second path 208 may include a third transistor 220, which may be a PFET, and a fourth transistor 222 cascoded relative to the third transistor 220. The fourth transistor 222 may be a PFET as well. Further, the second path 208 may have a voltage input 224, which may be coupled to the voltage rail Vcc or the like. The voltage input 224 may be coupled to a source 220S of the third transistor 220 through a third inductor 226. A drain 222D of the fourth transistor 222 may be coupled to ground through a fourth inductor 228. The NFETs and PFETs of the amplifier 200 may be made using bulk or SOI CMOS processes that use strain engineering to improve the hole mobility in the PFET channel.

Between the drain 222D and the fourth inductor 228, a node 230 may be defined. The node 230 may be coupled to the output 204 through a first capacitor 232.

The first path 206, and particularly a gate 212G of the second transistor 212, is coupled to the input 202 through a capacitor 236 and an input inductor 238. A resistor 240 is also coupled to the gate 212G.

The second path 208, and particularly a gate 220G of the third transistor 220, is coupled to the input 202 through a capacitor 242 and the input inductor 238. A resistor 244 is also coupled to the gate 220G.

The third inductor 226 may be inductively coupled to the second inductor 218 and the first inductor 216 may be inductively coupled to the fourth inductor 228. As noted, this may allow for a more compact layout of the amplifier 200 relative to the layout of the amplifier 100 of FIG. 1. Further, the mutual coupling of the load inductors 216, 228 allows elimination of a direct current (DC) blocking capacitor such as the second capacitor 134 of the amplifier 100.

The amplifier 200 preserves the split paths between the NFET and PFET arms of the design. The use of such parallel stacks rather than using a single current-sharing stack of conventional approaches preserves needed headroom while still allowing for lowering the supply voltage.

Figure 3:
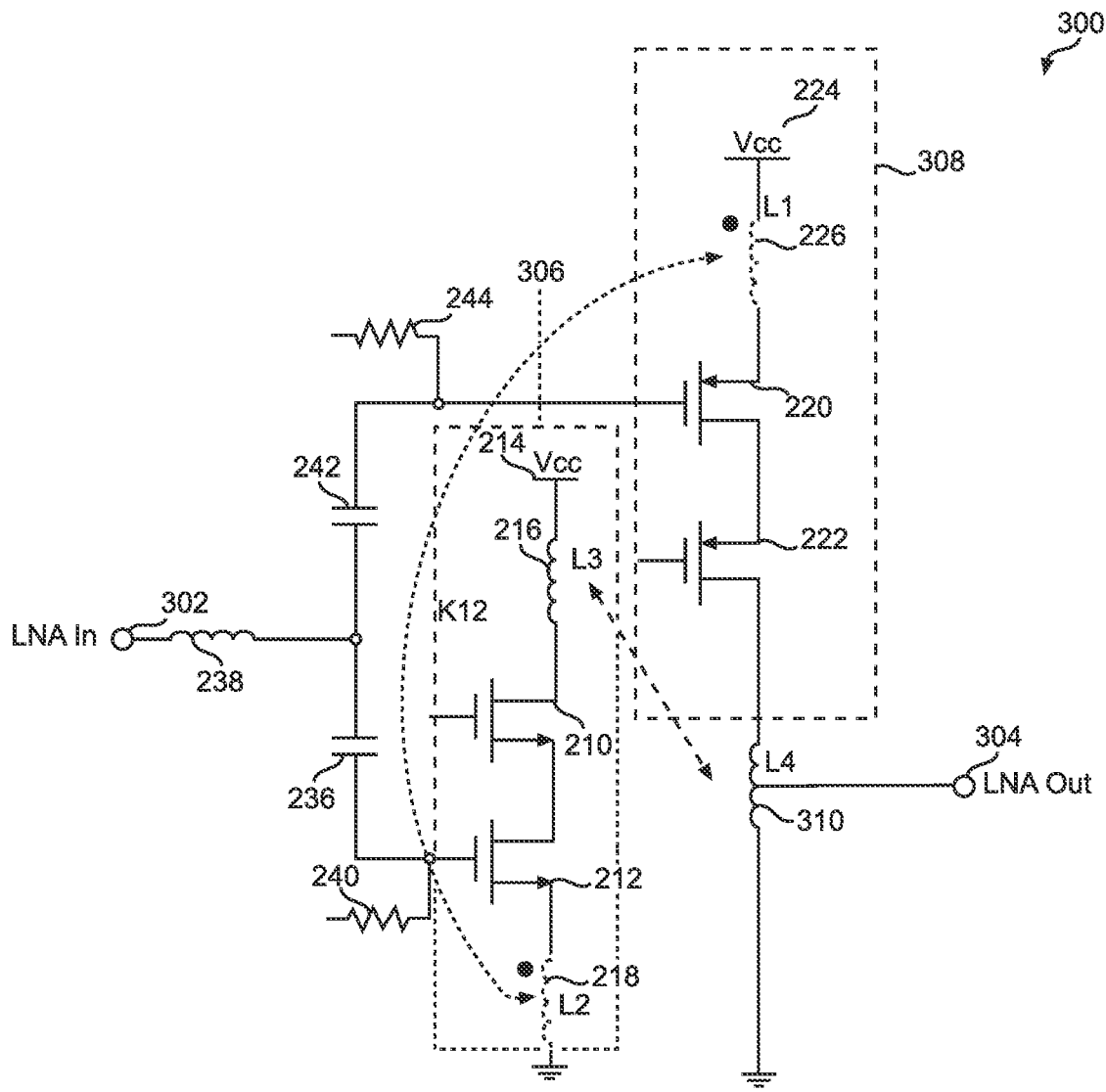
FIG. 3 is a circuit diagram of another exemplary single-ended complementary LNA based on cascoded common-source topology using inductors and a tapped-inductor output.

As still another exemplary aspect, the output match may be simplified through the use of a tapped inductor to create an output impedance transformation as illustrated by amplifier 300 in FIG. 3. The amplifier 300 may include an input 302 configured to receive a signal. In an exemplary aspect, the signal may be an RF signal from an antenna (not shown). The amplifier 300 may further include an output 304. The amplifier 300 may further include a first path 306 and a second path 308. Both the first path 306 and the second path 308 are coupled to the input 302 and the output 304 and are electrically parallel to one another without sharing any current.

In most aspects, the amplifier 300 is identical to the amplifier 200 of FIG. 2 and duplicative explanation is omitted. However, instead of the load inductor 228 and the load capacitor 232 forming an impedance matching circuit, a tapped inductor 310 is used. The position of the tap on the tapped inductor 310 allows for creation of and tuning of an impedance matching circuit for the amplifier 300.

Figure 4:
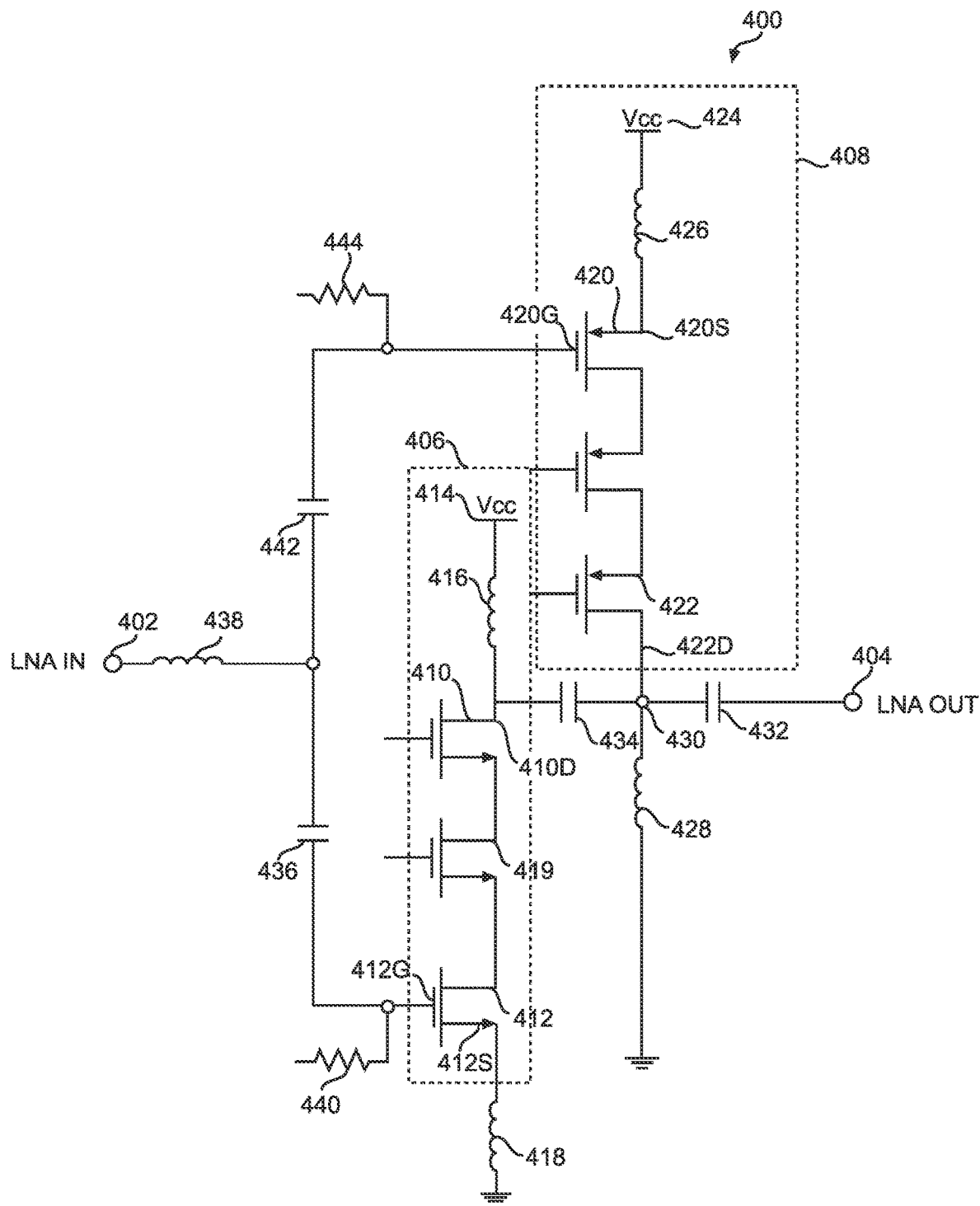
FIG. 4 is a circuit diagram of another exemplary single-ended complementary LNA based on cascoded common-source topology using double cascoded amplifier stack.

The additional headroom provided by the split paths may allow for additional cascoded transistors to be added. Such approach may improve output impedance of the amplifier and allowing for higher gain. The second cascode may also improve a stability factor for the amplifier. Such stability may otherwise be compromised when short channel FETs are used. FIG. 4 illustrates an amplifier 400 with such additional cascoded transistors.

As with the other exemplary amplifiers, the amplifier 400 may be an LNA. The amplifier 400 may include an input 402 configured to receive a signal. In an exemplary aspect, the signal may be an RF signal from an antenna (not shown). The amplifier 400 may further include an output 404. The amplifier 400 may further include a first path 406 and a second path 408. Both the first path 406 and the second path 408 are coupled to the input 402 and the output 404 and are electrically parallel to one another without sharing any current.

The first path 406 may include a first transistor 410, which may be an NFET, and a second transistor 412 cascoded relative to the first transistor 410. The second transistor 412 may be an NFET as well. Further, the first path 406 may have a voltage input 414, which may be coupled to a voltage rail Vcc or the like. The voltage input 414 may be coupled to a drain 410D of the first transistor 410 through a first inductor 416. A source 412S of the second transistor 412 may be coupled to ground through a second inductor 418. A fifth transistor 419 may be positioned between the first transistor 410 and the second transistor 412 to create a second cascode (i.e., a two stacked cascode).

The second path 408 may include a third transistor 420, which may be a PFET, and a fourth transistor 422 cascoded relative to the third transistor 420. The fourth transistor 422 may be a PFET as well. Further, the second path 408 may have a voltage input 424, which may be coupled to the voltage rail Vcc or the like. The voltage input 424 may be coupled to a source 420S of the third transistor 420 through a third inductor 426. A drain 422D of the fourth transistor 422 may be coupled to ground through a fourth inductor 428. A sixth transistor 423 may be positioned between the third transistor 420 and the fourth transistor 422 to create a second cascode. The NFETs and PFETs of the amplifier 400 may be made using bulk or SOI CMOS processes that use strain engineering to improve the hole mobility in the PFET channel.

Between the drain 422D and the fourth inductor 428, a node 430 may be defined. The node 430 may be coupled to the output 404 through a first capacitor 432 and to the drain 410D of the first transistor 410 through a second capacitor 434.

The first path 406, and particularly a gate 412G of the second transistor 412, is coupled to the input 402 through a capacitor 436 and an input inductor 438. A resistor 440 is also coupled to the gate 412G.

The second path 408, and particularly a gate 420G of the third transistor 420, is coupled to the input 402 through a capacitor 442 and the input inductor 438. A resistor 444 is also coupled to the gate 420G.

Exemplary aspects of the present disclosure provide an amplifier architecture that is capable of operating at low supply voltages (e.g., <1.2 V), with high gain (~20 dB), with a low noise factor (NF) (<approximately 0.6 dB), with a low overall power consumption (e.g., <7 mW), and with second and third order intercept points at desired levels (e.g., ~0 dBm and >+20 dBm, respectively). Having the desired features in the second and third order intercept points allows filtering for intermodulation distortion (IMD) for the amplifier to be relaxed as well as providing desired impedance matching for an associated antenna. All of this may be accomplished while still maintaining a relatively linear amplifier. Relaxation of the filtering provides the opportunity to use a simpler filter that may impose less loss than traditional filter approaches and/or be less expensive than traditional filter approaches.

The complementary balanced low-noise amplifier according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. An amplifier comprising:
an input configured to receive a signal;
an output;
a first path comprising:
a first common-source transistor; and
a second transistor cascoded relative to the first common-source transistor; and
a second path comprising:
a third common-source transistor; and
a fourth transistor cascoded relative to the third common-source transistor;
wherein the first path is coupled to the second path at the input and the output; and
wherein the first path and the second path do not share a common current.

2. The amplifier of claim 1, wherein the amplifier comprises a low noise amplifier.

3. The amplifier of claim 1, wherein the first common-source transistor comprises an N-type field effect transistor (NFET).

4. The amplifier of claim 3, wherein the third common-source transistor comprises a P-type field effect transistor (PFET).

5. The amplifier of claim 1, wherein the first path defines a first second order intercept point (IP2) based on a hypothetical point where power of second order components in the first path reach a same level as power of fundamental components in the first path, and the second path defines a second IP2 based on a second hypothetical point where power of second order components in the second path reach a same level as power of fundamental components in the second path, the second path, and the first path couples to the second path such that complementary structures in the first path and the second path cause the first IP2 to cancel substantially the second IP2.

6. The amplifier of claim 1, wherein the first path is coupled to the input through an input inductor.

7. The amplifier of claim 6, wherein the second path is coupled to the input through the input inductor.

8. The amplifier of claim 1, further comprising a first inductor, wherein the first common-source transistor is inductively degenerated by the first inductor.

9. The amplifier of claim 8, further comprising a second inductor, wherein the third common-source transistor is inductively degenerated by the second inductor.

10. The amplifier of claim 1, wherein the first path is coupled to the second path through a capacitor to a node, and the node is coupled through a second capacitor to the output.

11. The amplifier of claim 10, further comprising an inductor coupled to the node, wherein the inductor and the second capacitor act as an impedance matching circuit.

12. The amplifier of claim 9, further comprising a third inductor coupling the first path to ground and a fourth inductor coupling the second path to ground, wherein the first inductor is inductively coupled to the fourth inductor.

13. The amplifier of claim 12, wherein the output is coupled to a tap on the fourth inductor.

14. An amplifier comprising:
an input configured to receive a signal;
an output;
a first path defining a first second order intercept point (IP2) based on a hypothetical point where power of second order components in the first path reach a same level as power of fundamental components in the first path, the first path comprising:
a first common-source transistor; and
a second path defining a second IP2 based on a second hypothetical point where power of second order components in the second path reach a same level as power of fundamental components in the second path, the second path comprising:
a third common-source transistor;

wherein the first path is coupled to the second path at the input and the output; and wherein complementary structures of the first path and the second path cause the first IP2 to cancel substantially the second IP2.

15. The amplifier of claim 14, wherein the first path comprises a second transistor cascoded relative to the first common-source transistor.

16. The amplifier of claim 15, wherein the second path comprises a fourth transistor cascoded relative to the third common-source transistor.

17. The amplifier of claim 14, wherein the first path and the second path do not share a common current.

18. The amplifier of claim 16, wherein the first path comprises a fifth transistor positioned between the first common-source transistor and the second transistor and the second path comprises a sixth transistor positioned between the third common-source transistor and the fourth transistor.

19. An amplifier comprising:
an input configured to receive a signal;
an output;
a first path comprising:
  a first common-source transistor; and
a second path comprising:
  a third common-source transistor;
wherein the first path is coupled to the second path through a capacitor to a node, and the node is coupled through a second capacitor to the output and wherein the first path is coupled to the second path at the input.

* * * * *